(12) United States Patent
Zeng et al.

(10) Patent No.: US 12,088,057 B2
(45) Date of Patent: Sep. 10, 2024

(54) DRIVING AND STABILIZATION SYSTEM FOR PUMP LASER

(71) Applicants: Chongqing Institute of East China Normal University, Chongqing (CN); ROI Optoelectronics Technology CO, LTD., Shanghai (CN); East China Normal University, Shanghai (CN)

(72) Inventors: Heping Zeng, Chongqing (CN); Xiao Wang, Chongqing (CN); Shuang Li, Chongqing (CN); Mengyun Hu, Chongqing (CN)

(73) Assignees: CHONGQING INSTITUTE OF EAST CHINA NORMAL UNIVERSITY, Chongqing (CN); ROI OPTOELECTRONICS TECHNOLOGY CO, LTD., Shanghai (CN); EAST CHINA NORMAL UNIVERSITY, Shanghai (CN)

( * ) Notice: Subject to any disclaimer, the term of this patent is extended or adjusted under 35 U.S.C. 154(b) by 535 days.

(21) Appl. No.: 17/528,315

(22) Filed: Nov. 17, 2021

(65) Prior Publication Data
US 2022/0158409 A1    May 19, 2022

(30) Foreign Application Priority Data
Nov. 17, 2020    (CN) .......................... 202011281958.4

(51) Int. Cl.
*H01S 3/13*    (2006.01)
*H01S 3/00*    (2006.01)
(Continued)

(52) U.S. Cl.
CPC .......... *H01S 3/1305* (2013.01); *H01S 3/0014* (2013.01); *H01S 3/09415* (2013.01);
(Continued)

(58) Field of Classification Search
CPC .. H01S 3/1305; H01S 3/0014; H01S 3/09415; H01S 3/13013; H01S 3/13017;
(Continued)

(56) References Cited

U.S. PATENT DOCUMENTS

2011/0188523 A1*  8/2011  Hargis ..................... H01S 5/146
                                                           372/21
2015/0115219 A1*  4/2015  Oh .......................... H01S 5/041
                                                           438/31

FOREIGN PATENT DOCUMENTS

CN    103701033        *   4/2014
CN    103701033   A        4/2014
(Continued)

OTHER PUBLICATIONS

CNIPA, First Office Action for CN Application No. 202011281958. 4, Apr. 21, 2022.

*Primary Examiner* — Michael Carter
(74) *Attorney, Agent, or Firm* — Hodgson Russ LLP

(57) ABSTRACT

A driving and stabilization system for a pump laser, and a pump laser system. The driving and stabilization system includes a constant current stabilization device, a constant temperature stabilization device, a power detection device, an environment detection device, and a control device. The constant current stabilization device includes a voltage comparison circuit, a constant current driving circuit, and a switch protection circuit. The constant temperature stabilization device includes an internal constant temperature stabilization circuit and an external constant temperature stabilization circuit.

16 Claims, 5 Drawing Sheets

(51) Int. Cl.
*H01S 3/0941* (2006.01)
*H01S 5/024* (2006.01)
*H01S 5/068* (2006.01)
*H01S 5/0683* (2006.01)

(52) U.S. Cl.
CPC ...... *H01S 3/13013* (2019.08); *H01S 3/13017* (2019.08); *H01S 5/02415* (2013.01); *H01S 5/02446* (2013.01); *H01S 5/06804* (2013.01); *H01S 5/06808* (2013.01); *H01S 5/0683* (2013.01)

(58) Field of Classification Search
CPC ............. H01S 5/02415; H01S 5/02446; H01S 5/06804; H01S 5/06808; H01S 5/0683
See application file for complete search history.

(56) References Cited

FOREIGN PATENT DOCUMENTS

| | | |
|---|---|---|
| CN | 106785876 A | 5/2017 |
| GB | 2218566 A | 11/1989 |

\* cited by examiner

DRIVING AND STABILIZATION SYSTEM FOR PUMP LASER

CROSS-REFERENCE TO RELATED APPLICATION

This application claims priority to, and the benefits of, Chinese Patent Application Serial No. 202011281958.4, filed on Nov. 17, 2020, the entire content of which is incorporated herein by reference.

FIELD

The present disclosure relates to a field of a pump laser, and more particularly to a driving and stabilization system for a pump laser and a pump laser system having the same.

BACKGROUND

Pump laser, an electric-optic converting element, is widely used in fiber pulse lasers, erbium doped fiber amplifiers, and ytterbium doped fiber amplifiers. During operation, small changes in current and temperature will cause a large change in output optical power. Stable driving current and operation temperature of the pump laser are desired for stable output power.

In existing laser driving technologies, in order to improve the stability of the pump laser, an operating state of the pump laser inner shell is considered. However, an operating state of an external stabilization grating is rarely discussed. A drift of the external environment temperature with time may affect the stability of the pump laser. Therefore, there is still a need to improve the stability of the pump laser in a long term operation.

SUMMARY

Embodiments of the present disclosure seek to solve at least one of the problems existing in the related art to at least some extent.

In a first aspect, a driving and stabilization system for a pump laser is provided. The pump laser includes a laser diode, a semiconductor cooler and a laser detector, and is connected to a stabilization grating at a tail thereof. The driving and stabilization system includes: a control device configured to output a constant current algorithm voltage by a built-in algorithm of the control device, and output a switching signal; a constant current stabilization device including: a voltage comparison circuit configured to receive and compare a constant current setting voltage, the constant current algorithm voltage and a constant current feedback voltage from the control device to output a constant current control voltage according to a comparison result, a constant current driving circuit connected to the laser diode, and configured to receive the constant current control voltage from the voltage comparison circuit and output a constant driving current according to the constant current control voltage, and a switch protection circuit connected to the laser diode, and configured to receive a switching signal from the control device to control the passage of the constant driving current through the laser diode; a constant temperature stabilization device including: an internal constant temperature stabilization circuit connected to the semiconductor cooler in the pump laser, and configured to receive an internal temperature control parameter and output a first PWM temperature control signal to the semiconductor cooler in the pump laser according to the internal temperature control parameter, and an external constant temperature stabilization circuit connected to an external semiconductor cooler at the stabilization grating, and configured to receive an external temperature control parameter and output a second PWM temperature control signal to the external semiconductor cooler at the stabilization grating according to the external temperature control parameter; a power detection device connected to the laser detector in the pump laser, and configured to receive a power detection current from the pump laser and output a power detection voltage to the control device; and an environment detection device connected to a grating environment temperature resistor and a system environment temperature resistor, and configured to receive a grating environment voltage from the grating environment temperature resistor and a system environment voltage from the system environment temperature resistor, and output an environment detection voltage to the control device.

In some embodiments, the constant current driving circuit comprises an input terminal and an output terminal. The input terminal of the constant current driving circuit is configured to receive the constant current control voltage output by the voltage comparison circuit, the output terminal of the constant current driving circuit is configured to output the constant driving current.

In some embodiments, the voltage comparison circuit comprises a first input terminal, a second input terminal, a third input terminal and an output terminal. The first input terminal of the voltage comparison circuit is configured to receive the constant current setting voltage, the second input terminal of the voltage comparison circuit is configured to receive the constant current algorithm voltage, the third input terminal of the voltage comparison circuit is configured to receive the constant current feedback voltage, and the output terminal of the voltage comparison circuit is connected to the input terminal of the constant current driving circuit and configured to output the constant current control voltage.

In some embodiments, the switch protection circuit comprises an input terminal and an output terminal. The input terminal of the switch protection circuit is configured to receive the switching signal, and the output terminal of the switch protection circuit is connected to the laser diode.

In some embodiments, the internal constant temperature stabilization circuit comprises an input terminal, and an output terminal. The input terminal of the internal constant temperature stabilization circuit is configured to receive the internal temperature control parameter, and the output terminal of the internal constant temperature stabilization circuit is connected to the semiconductor cooler in the pump laser and configured to output the first PWM temperature control signal.

In some embodiments, the external constant temperature stabilization circuit comprises an input terminal, and an output terminal. The input terminal of the external constant temperature stabilization circuit is configured to receive the external temperature control parameter, and the output terminal of the external constant temperature stabilization circuit is connected to the external semiconductor cooler at the stabilization grating and configured to output the second PWM temperature control signal.

In some embodiments, the power detection device comprises an input terminal and an output terminal. The input terminal of the power detection device is configured to receive the power detection current output by the laser detector in the pump laser, and the output terminal of the power detection device is connected to the control device and configured to output the power detection voltage.

In some embodiments, the environment detection device comprises a first input terminal, a second input terminal and an output terminal. The first input terminal of the environment detection device is configured to receive the grating environment voltage output by the grating environment temperature resistor, the second input terminal of the environment detection device is configured to receive the system environment voltage output by the system environment temperature resistor, and the output terminal of the environment detection device is connected to the control device and configured to output the environment detection voltage.

In some embodiments, the control device comprises a first input terminal, a second input terminal, a first output terminal, a second output terminal and a third output terminal. The first input terminal of the control device is configured to receive the power detection voltage output by the power detection system, the second input terminal of the control device is configured to receive the system environment voltage output by the environment detection system, the first output terminal of the control device is connected to the first input terminal of the voltage comparison circuit and configured to output the constant current setting voltage, the second output terminal of the control device is connected to the second input terminal of the voltage comparison circuit and configured to output the constant current algorithm voltage, and the third output terminal of the control device is connected to the switch protection circuit and configured to output the switching signal.

In some embodiments, the laser diode is cross connected to a laser diode stabilization circuit comprising a stabilization capacitor and a stabilization diode, the stabilization capacitor is connected to the laser diode in parallel, and the stabilization diode is connected to the laser diode in parallel.

In some embodiments, the voltage comparison circuit comprises an AD8630-type operational amplifier.

In some embodiments, the switch protection circuit includes an N-channel field effect transistor.

In some embodiments, the constant current driving circuit includes an AD8630-type operational amplifier and an N-channel field effect transistor.

In some embodiments, the constant temperature stabilization circuit includes a first constant temperature driving chip and a second constant temperature driving chip.

In some embodiments, the first constant temperature driving chip and the second constant temperature driving chip are MTD415TE-type constant temperature driving chips.

In a second aspect, a pump laser system is provided. The pump laser system includes a pump laser and the driving and stabilization system for the pump laser as described in the first aspect.

REFERENCE NUMERALS

Figure 1:
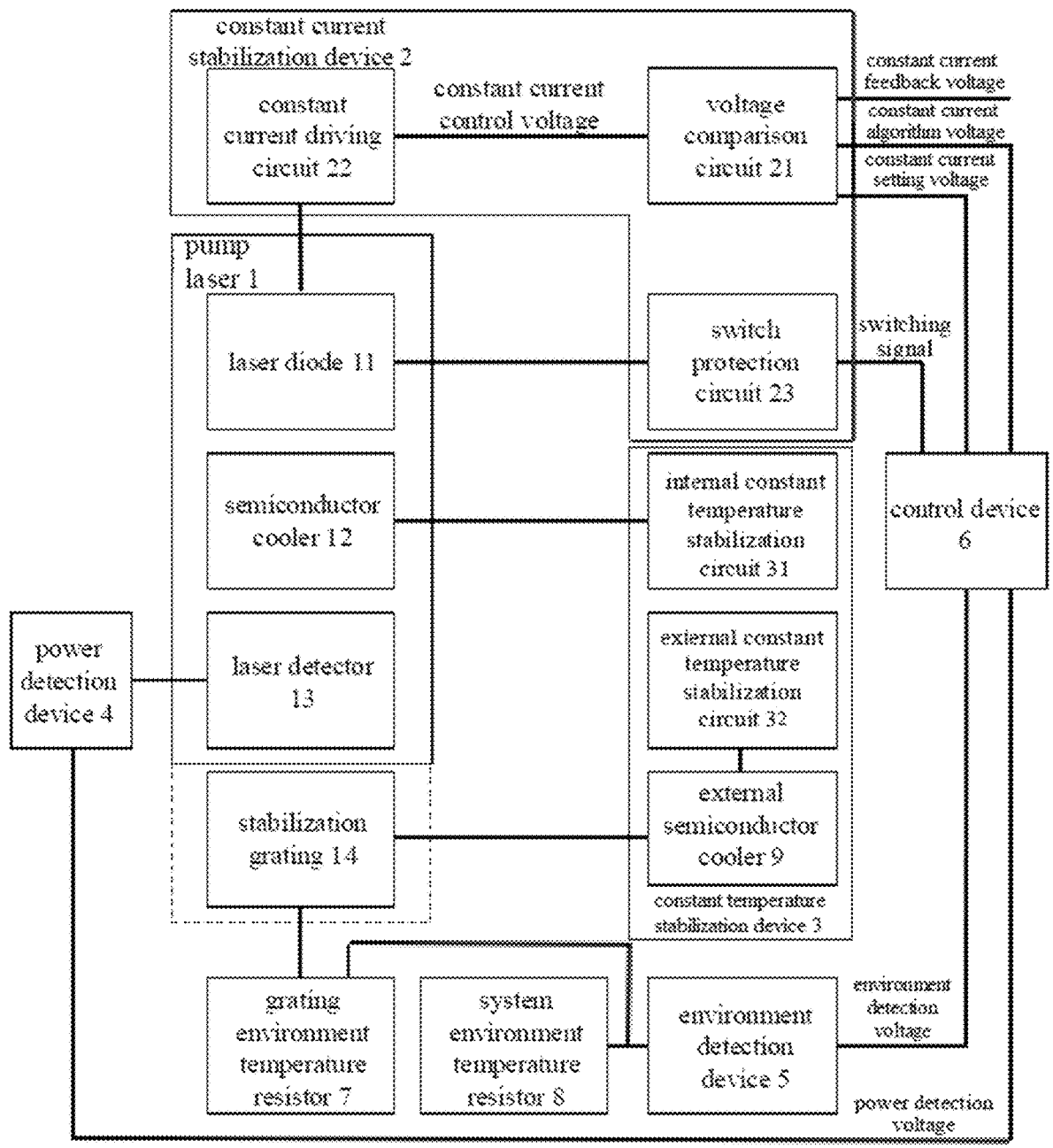
FIG. 1 is a block diagram showing a driving and stabilization system for a pump laser according to an embodiment of the present disclosure.

1: pump laser; 11: laser diode; 12: semiconductor cooler; 13: laser detector; 14: stabilization grating; 2: constant current stabilization device; 21: voltage comparison circuit: 22: constant current driving circuit; 23: switch protection circuit; 3: constant temperature stabilization device; 31: internal constant temperature stabilization circuit; 32: external constant temperature stabilization circuit; 4: power detection device; 5: environment detection device; 6: control device; 7: grating environment temperature resistor; 8: system environment temperature resistor; 9: external semiconductor cooler.

DETAILED DESCRIPTION

Embodiments of the present disclosure are described in detail below, examples of which are illustrated in the drawings. The same or similar elements are denoted by same reference numerals in different drawings unless indicated otherwise. The embodiments described herein with reference to drawings are explanatory, and used to generally understand the present disclosure. The embodiments shall not be construed to limit the present disclosure.

As shown in FIG. 1, a driving and stabilization system for a pump laser is provided. The pump laser 1 includes a laser diode 11, a semiconductor cooler 12 and a laser detector 13, and is connected to a stabilization grating 14 at a tail thereof. The driving and stabilization system includes a constant current stabilization device 2, a constant temperature stabilization device 3, a power detection device 4, an environment detection device 5, a control device 6, a grating environment temperature resistor 7, a system environment temperature resistor 8, and an external semiconductor cooler 9.

The constant current stabilization device 2 includes a voltage comparison circuit 21, a constant current driving circuit 22, and a switch protection circuit 23. The constant current driving circuit 22 and the switch protection circuit 23 are connected to the laser diode 11. The voltage comparison circuit 21 includes a first input terminal, a second input terminal, a third input terminal and an output terminal. The constant current driving circuit 22 includes an input terminal and an output terminal. The switch protection circuit 23 includes an input terminal and an output terminal. The first input terminal of the voltage comparison circuit 21 is connected to the control device 6 and configured to receive a constant current setting voltage, the second input terminal of the voltage comparison circuit 21 is connected to the control device 6 and configured to receive a constant current algorithm voltage, the third input terminal of the voltage comparison circuit 21 is configured to receive a constant current feedback voltage, and the output terminal of the voltage comparison circuit 21 is connected to the constant current driving circuit 22 and configured to output a constant current control voltage. The input terminal of the constant current driving circuit 22 is configured to receive the constant current control voltage and output a constant driving current according to the constant current control voltage. The input terminal of the switch protection circuit 23 is configured to receive a switching signal to control the passage of the constant driving current (to be closed or to be opened) according to the switching signal, thereby controlling the driving current to flow into the laser diode 11. The output of the pump laser 1 is determined by the driving current.

Figure 3:
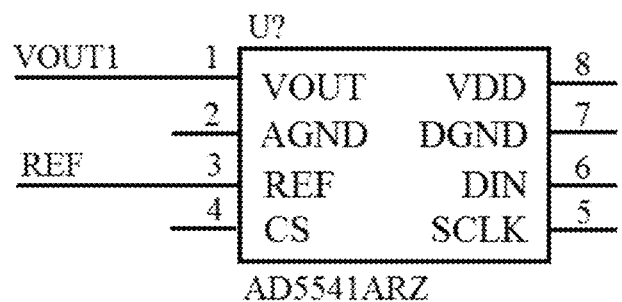
FIG. 3 is a schematic diagram showing a D/A converter according to an embodiment of the present disclosure.
Figure 5:
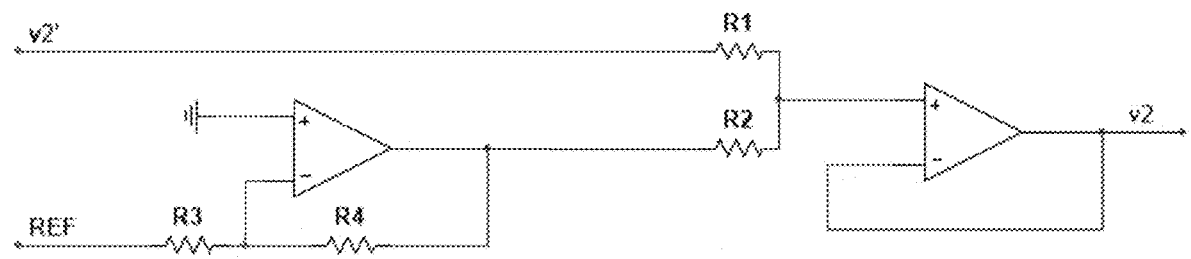
FIG. 5 is a schematic circuit diagram of a control device according to an embodiment of the present disclosure.
Figure 6:
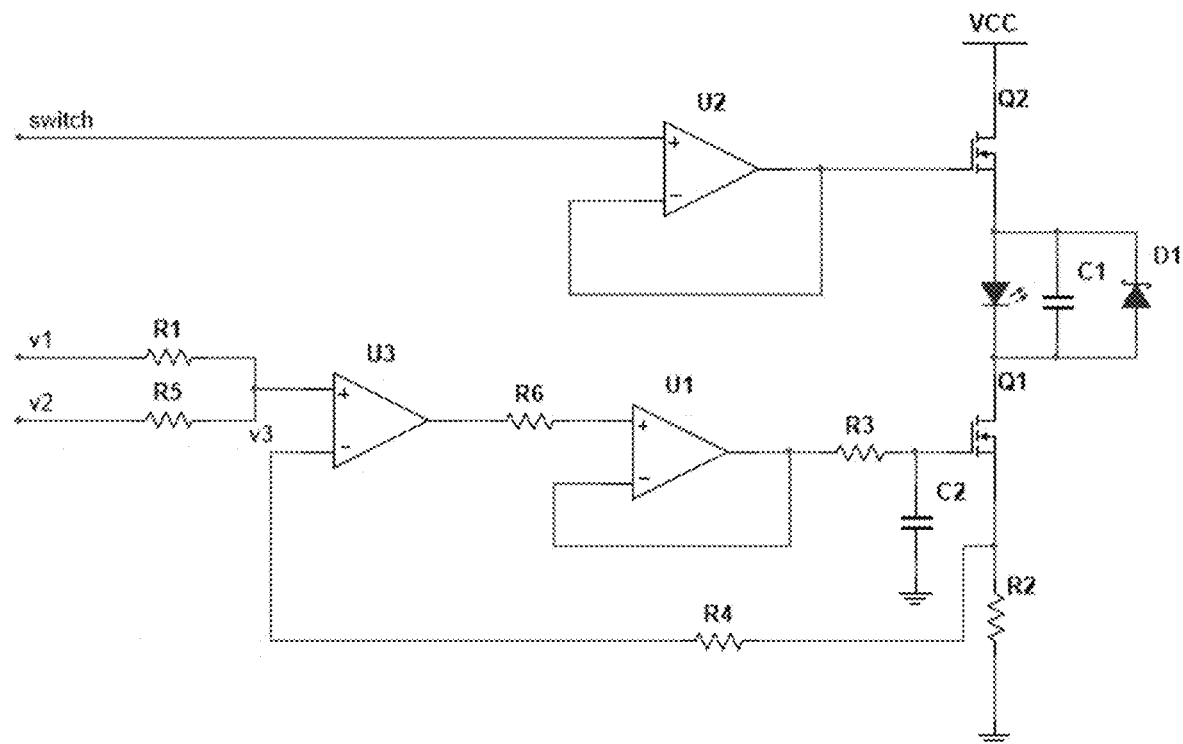
FIG. 6 is a schematic circuit diagram of a constant current driving circuit according to an embodiment of the present disclosure.

The constant current control voltage is a voltage generated by the voltage comparison circuit according to the constant current setting voltage, the constant current algorithm voltage and the constant current feedback voltage received by the voltage comparison circuit, and may control the driving current output by the constant current driving circuit. The constant current setting voltage is output by a 16-bit D/A converter, and is controlled by the control device 6 to determine the magnitude of the constant current setting voltage. As shown in FIG. 3, a chip U8 is used as the above-mentioned D/A converter, and VOUT1 represents the output, i.e., the constant current setting voltage, which corresponds to v1 in FIG. 6. In FIG. 6, v2 represents the constant current algorithm voltage, which is generated by the control device 6. As shown in FIG. 5, the control device 6 is configured to calculate a 16-bit parameter by a built-in algorithm and generate a voltage signal v2' by the 16-bit D/A converter. The voltage signal v2' is biased to about 0V through a bias circuit and used as the constant current algorithm voltage v2. In FIG. 6, v3 represents the constant current feedback voltage, and is generated by a sampling resistor in the constant current driving circuit. The voltage comparison circuit includes an AD8630-type operational amplifier. In FIG. 6, the "switch" refers to the input terminal of the switch protection circuit 23. The output terminal of the switch protection circuit 23 is connected with the laser diode 11 in series, and the input terminal of switch protection circuit 23 is configured to receive a switching signal generated by the control device 6 to control the driving current to flow into the laser diode 11. The switch protection circuit includes an N-channel field effect transistor Q2. A gate of the field effect transistor Q2 is the input terminal of the switch protection circuit 23, and a source and a drain of the field effect transistor Q2 together form the output terminal of the switch protection circuit 23. When the control system 6 detects that the driving and stabilization system is in an abnormal operating state, the switching signal is output to turn off the field effect transistor, thereby protecting the laser diode 11, and the laser diode 11 will restore a normal operation after the abnormal state is resolved. In an embodiment, as shown in FIG. 6, the constant current driving circuit 22 includes an AD8630-type operational amplifier U1 and an N-channel field effect transistor Q1. As shown in FIG. 6, the laser diode 11 is connected to a stabilization capacitor C1 and a stabilization diode in parallel, which may effectively compensate fluctuations of the driving current when the laser diode is operating. When the driving current changes greatly, the stabilizing capacitor C1 and the stabilizing diode may absorb or release a certain current and voltage to reduce the change of the driving current, and stably adjust the operating state of the laser diode.

Figure 2:
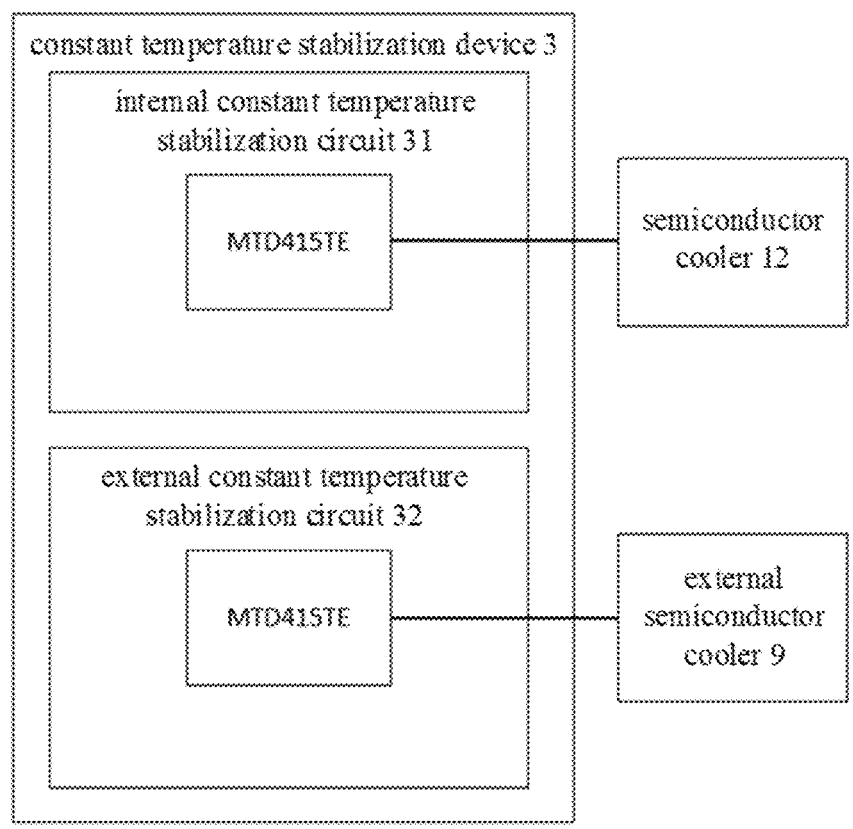
FIG. 2 is a block diagram showing a constant temperature stabilization device according to an embodiment of the present disclosure.
Figures 7, 8:
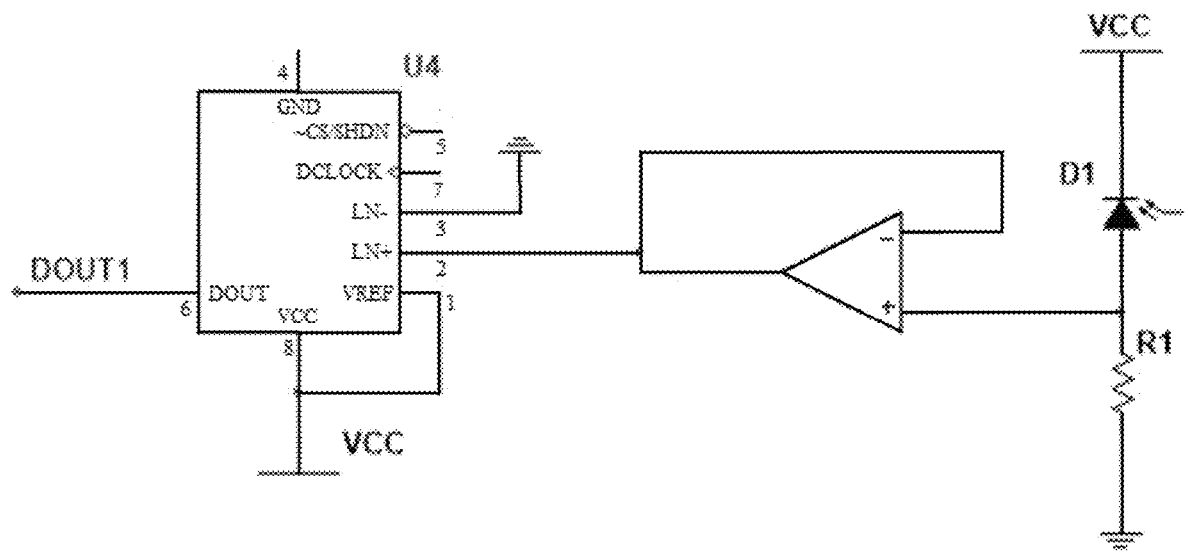
FIG. 7 is a schematic circuit diagram of a power detection device according to an embodiment of the present disclosure.
FIG. 8 is a schematic diagram showing a constant temperature driving chip in the present disclosure.

As shown in FIG. 2, the constant temperature stabilization device 3 includes an internal constant temperature stabilization circuit and an external constant temperature stabilization circuit. In an embodiment, the constant temperature stabilization circuit includes a first constant temperature driving chip and a second constant temperature driving chip, which are a MTD415TE-type constant temperature driving chip integrated with a PID control circuit, a PWM signal generating circuit and an H bridge circuit. As shown in FIG. 8, in the integrated constant temperature driving chip, a RX terminal is used as a first input terminal to input a control temperature parameter, and a TEMP terminal is used as a second input terminal to input a temperature resistance voltage. According to the control temperature parameter and the temperature resistance voltage, a first PWM temperature control signal is output to the semiconductor cooler 12, and a second PWM temperature control signal is output to the external semiconductor cooler 9.

As shown in FIG. 7, the power detection device 4 includes an input terminal and an output terminal. The input terminal of the power detection device 4 is configured to receive a power detection current output by the laser detector in the pump laser, and convert the power detection current into a power detection voltage. The output terminal of the power detection device 4 is represented as DOUT1 to output the power detection voltage to the control device 6, such that the control device 6 may detect the stability of the output power of the laser diode, and process and calculate by the built-in algorithm.

By the built-in algorithm, the overall driving and stabilization system is optimized, and the pump laser is stably controlled in hardware circuit and software algorithm to protect the pump laser from overcurrent, overvoltage, and electrostatic hazards, and improve the resistance of the pump laser to environmental changes and operating stability.

Figure 4:
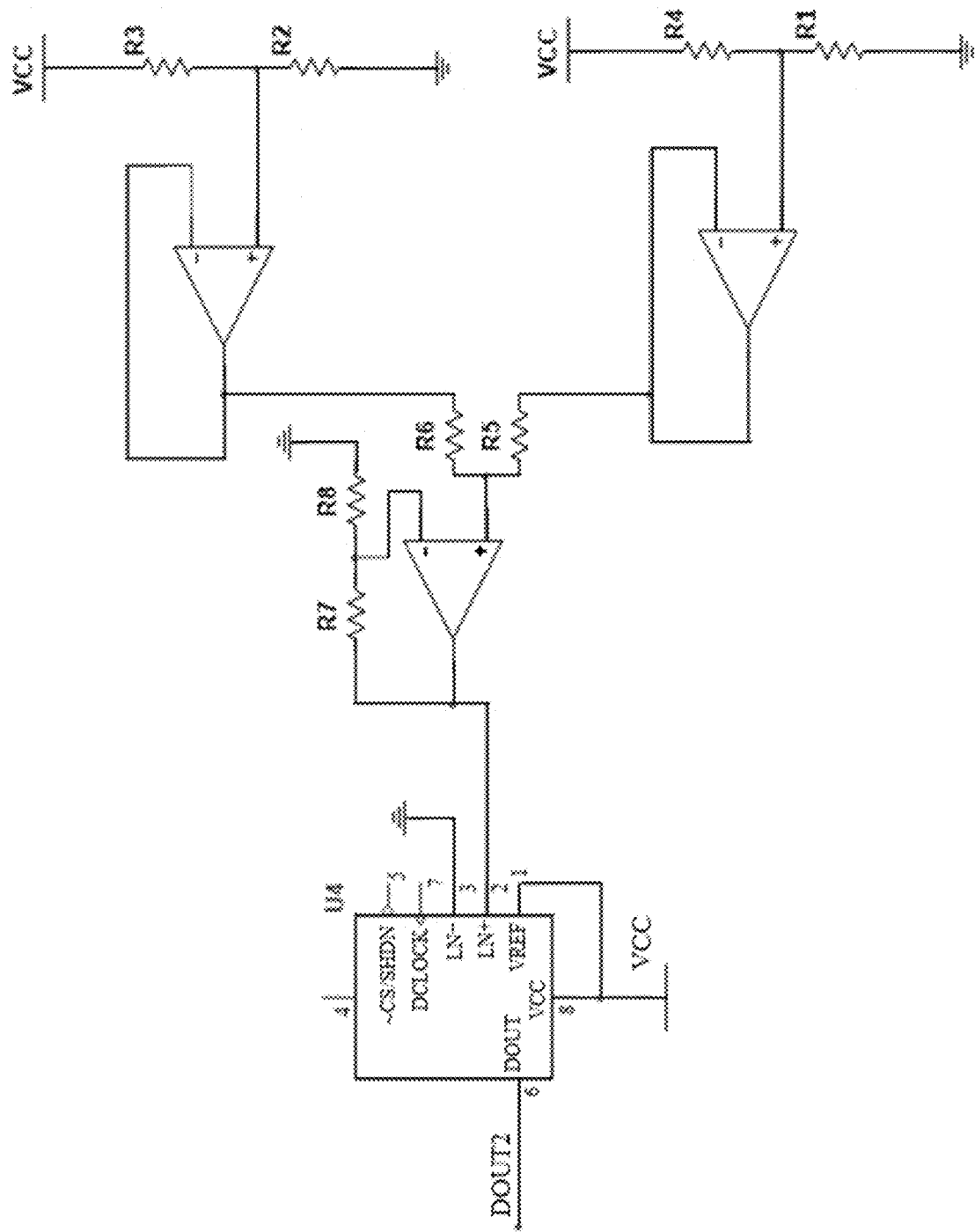
FIG. 4 is a schematic circuit diagram of an environment detection device according to an embodiment of the present disclosure.

As shown in FIG. 4, the environment detection device 5 includes a first input terminal, a second input terminal and an output terminal. The first input terminal of the environment detection device 5 is configured to receive a grating environment voltage output by the grating environment temperature resistor, the second input terminal of the environment detection device 5 is configured to receive a system environment voltage output by the system environment temperature resistor, and the output terminal of the environment detection device 5 is represented as DOUT2 and configured to output the environment detection voltage to the control device 6, such that the control device 6 may detect the operating stability of the pump laser, and process and calculate by a built-in algorithm.

As shown in FIG. 1, the control device 6 includes a first input terminal, a second input terminal, a first output terminal, a second output terminal and a third output terminal. The control device 6 has FPGA, a single-chip microcomputer as a main control chip and a software algorithm realization chip. The first input terminal of the control device 6 is configured to receive the power detection voltage output by the power detection device 4, calculate an average value and a variance of the power detection voltage to calculate a first compensation parameter according to magnitude and sign of deviation. The first compensation parameter is used as a fluctuation compensation parameter of the pump laser in short term. The second input terminal of the control device 6 is configured to receive the system environment voltage output by the environment detection system 5, and calculate an average value and a variance of the system environment voltage to calculate a second compensation parameter according to magnitude and change trend of deviation. The second compensation parameter is used as a drift compensation parameter of the pump laser in long term. The first output terminal of the control device 6 is configured to output the constant current setting voltage, the second output terminal of the control device 6 is configured to output the constant current algorithm voltage generated by the fluctuation compensation parameter and the drift compensation parameter, and the third output terminal of the control device 6 is connected to the switch protection circuit and configured to output the switching signal. When the power detection voltage and the environment detection voltage are detected to be out of a normal range, the switching signal is output to turn off the switch protection circuit 23, such that the driving current does not flow into the laser diode.

An operating flow in embodiments of the present disclosure is described as follows.

For a constant current stabilization device:

A suitable constant current setting voltage of a voltage comparison circuit 21 is set according to an operation state. The constant current setting voltage first acts to generate a constant current control voltage, and a constant driving current is input to flow through the laser diode 11 to allow the pump laser 1 to operate. An initial value of a constant current algorithm voltage is 0. During operation, the control device 6 generates a certain constant current algorithm voltage to compensate the laser diode 11 to improve the stability of the laser diode 11. A constant current feedback voltage is generated when a constant current driving circuit 22 is operating, and acts together with the constant current setting voltage and the constant current algorithm voltage to maintain the driving current at a stable constant value. Normally, a switch protection circuit 23 is turned on. When the control device 6 detects that a power detection voltage is higher than a certain value, or an environment detection voltage is out of a normal operating range, a switching signal is output to turn off the switch protection circuit 23, such that the laser diode 11 will not be operated in an abnormal operating state. When the abnormality of the device is resolved, the switch signal is output to turn on the switch protection circuit 23 to make the laser diode 11 operate normally.

For a constant temperature stabilization device:

A suitable temperature control parameter is set for an internal constant temperature stabilization circuit 31 according to actual needs, and then the internal constant temperature stabilization circuit 31 outputs a first PWM temperature control signal to control a semiconductor cooler 12 for cooling, such that the laser diode 11 operates at a stable temperature. Meanwhile, a suitable temperature control parameter is set for the external constant temperature stabilization circuit 32 as actual needs, and then the external constant temperature stabilization circuit 32 outputs a second PWM temperature control signal to make an external semiconductor cooler 9 to control a temperature, to allow a stabilization grating 14 at the external semiconductor cooler 9 to operate at a stable temperature. The combination of the internal constant temperature stabilization circuit 31 and the external constant temperature stabilization circuit 32 may make the pump laser 1 run stably.

For a power detection device, an environmental detection device, and the control device:

When the pump laser 1 operates, the power detection device 4, the environmental detection device 5, and the control device 5 operate as well. The power detection device 4 converts a power detection current generated by a laser detector 13 into a power detection voltage and inputs it to the control device 6. The control device 6 calculates an average value and a variance of the power detection voltage, to obtain a fluctuation compensation parameter according to magnitude and sign of the power detection voltage. The environmental detection device 5 converts a voltage value of a stable grating temperature resistance 7 and a voltage value of a system environmental temperature resistance 8 into a grating environmental detection voltage and a system environment voltage, respectively, which are input to the control system 6. The control device 6 calculates an average value and a variance of each environmental detection voltage, and calculates a deviation and drift trend of each environmental detection voltage to obtain a drift compensation parameter. The fluctuation compensation parameter and the drift compensation parameter are converted into the constant current algorithm voltage to generate the constant current control voltage through the voltage comparison circuit 21. The constant current control voltage may compensate the driving current through the constant current driving circuit 22 to reduce the fluctuation of the laser diode 11 in short term, and compensate the drift to make the pump laser 1 output stably in long term.

The driving and stabilization system of the pump laser is capable of improving a hardware stabilization driving and software stabilization of the pump laser. The beneficial effects of the present disclosure are as follows.

In the present disclosure, the voltage comparison circuit and the switch protection circuit are provided to control the passage of the constant driving current of the constant current driving circuit, which provides stable operating conditions for the pump laser in hardware in a short term. The internal constant temperature stabilization circuit and the external constant temperature stabilization circuit are provided to keep the pump laser and the stabilizing grating in stable operating conditions, such that the pump laser may stable operate in the short term.

In the present disclosure, the power detection device is provided, which may directly detect the output power of the pump laser, and output the power detection voltage. The environment detection device is provided, which may detect the grating environment temperature and the system environment temperature, and output the environment detection voltage. The control device is provided, which may receive the power detection voltage and the environment detection voltage, and output the constant current algorithm voltage to compensate operating fluctuations in the short term and operating drifts in long term of the pump laser.

The present disclosure also provides a pump laser system (as shown in FIG. 1). The pump laser system include a pump laser and a driving and stabilization system for the pump system as described above. The features and advantages of the driving and stabilization system described above are also applicable to the pump laser system.

In addition, terms such as "first" and "second" are used herein for purposes of description and are not intended to indicate or imply relative importance or significance or to imply the number of indicated technical features. Thus, the feature defined with "first" and "second" may include one or more of this feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A driving and stabilization system for a pump laser, the pump laser comprising a laser diode, a semiconductor cooler and a laser detector, and connected to a stabilization grating at a tail thereof; the driving and stabilization system comprising:
   a control device configured to output a constant current algorithm voltage by a built-in algorithm of the control device, and output a switching signal;
   a constant current stabilization device comprising:
      a voltage comparison circuit configured to receive and compare a constant current setting voltage, the constant current algorithm voltage and a constant current feedback voltage from the control device to output a constant current control voltage according to a comparison result,
      a constant current driving circuit connected to the laser diode, and configured to receive the constant current control voltage from the voltage comparison circuit and output a constant driving current according to the constant current control voltage, and
      a switch protection circuit connected to the laser diode, and configured to receive the switching signal from the control device to control the passage of the constant driving current through the laser diode;
   a constant temperature stabilization device comprising:
      an internal constant temperature stabilization circuit connected to the semiconductor cooler in the pump laser, and configured to receive an internal temperature control parameter and output a first PWM temperature control signal to the semiconductor cooler in the pump laser according to the internal temperature control parameter, and
      an external constant temperature stabilization circuit connected to an external semiconductor cooler at the stabilization grating, and configured to receive an external temperature control parameter and output a second PWM temperature control signal to the external semiconductor cooler at the stabilization grating according to the external temperature control parameter;
   a power detection device connected to the laser detector in the pump laser, and configured to receive a power detection current from the pump laser and output a power detection voltage to the control device; and
   an environment detection device connected to a grating environment temperature resistor and a system environment temperature resistor, and configured to receive a grating environment voltage from the grating environment temperature resistor and a system environment voltage from the system environment temperature resistor, and output an environment detection voltage to the control device.

2. The driving and stabilization system according to claim 1, wherein the constant current driving circuit comprises an input terminal and an output terminal, wherein the input terminal of the constant current driving circuit is configured to receive the constant current control voltage output by the voltage comparison circuit, the output terminal of the constant current driving circuit is configured to output the constant driving current.

3. The driving and stabilization system according to claim 2, wherein the voltage comparison circuit comprises a first input terminal, a second input terminal, a third input terminal and an output terminal, wherein the first input terminal of the voltage comparison circuit is configured to receive the constant current setting voltage, the second input terminal of the voltage comparison circuit is configured to receive the constant current algorithm voltage, the third input terminal of the voltage comparison circuit is configured to receive the constant current feedback voltage, and the output terminal of the voltage comparison circuit is connected to the input terminal of the constant current driving circuit and configured to output the constant current control voltage.

4. The driving and stabilization system according to claim 3, wherein the control device comprises a first input terminal, a second input terminal, a first output terminal, a second output terminal and a third output terminal, wherein the first input terminal of the control device is configured to receive the power detection voltage output by the power detection system, the second input terminal of the control device is configured to receive the system environment voltage output by the environment detection system, the first output terminal of the control device is connected to the first input terminal of the voltage comparison circuit and configured to output the constant current setting voltage, the second output terminal of the control device is connected to the second input terminal of the voltage comparison circuit and configured to output the constant current algorithm voltage, and the third output terminal of the control device is connected to the switch protection circuit and configured to output the switching signal.

5. The driving and stabilization system according to claim 1, wherein the switch protection circuit comprises an input terminal and an output terminal, wherein the input terminal of the switch protection circuit is configured to receive the switching signal, and the output terminal of the switch protection circuit is connected to the laser diode.

6. The driving and stabilization system according to claim 1, wherein the internal constant temperature stabilization circuit comprises an input terminal, and an output terminal, wherein the input terminal of the internal constant temperature stabilization circuit is configured to receive the internal temperature control parameter, and the output terminal of the internal constant temperature stabilization circuit is connected to the semiconductor cooler in the pump laser and configured to output the first PWM temperature control signal.

7. The driving and stabilization system according to claim 1, wherein the external constant temperature stabilization circuit comprises an input terminal, and an output terminal, wherein the input terminal of the external constant temperature stabilization circuit is configured to receive the external temperature control parameter, and the output terminal of the external constant temperature stabilization circuit is connected to the external semiconductor cooler at the stabilization grating and configured to output the second PWM temperature control signal.

8. The driving and stabilization system according to claim 1, wherein the power detection device comprises an input terminal and an output terminal, wherein the input terminal of the power detection device is configured to receive the power detection current output by the laser detector in the pump laser, and the output terminal of the power detection device is connected to the control device and configured to output the power detection voltage.

9. The driving and stabilization system according to claim 1, wherein the environment detection device comprises a first input terminal, a second input terminal and an output terminal, wherein the first input terminal of the environment detection device is configured to receive the grating environment voltage output by the grating environment temperature resistor, the second input terminal of the environment detection device is configured to receive the system environment voltage output by the system environment temperature resistor, and the output terminal of the environment detection device is connected to the control device and configured to output the environment detection voltage.

10. The driving and stabilization system according to claim 1, wherein the laser diode is cross connected to a laser diode stabilization circuit comprising a stabilization capacitor and a stabilization diode, the stabilization capacitor is connected to the laser diode in parallel, and the stabilization diode is connected to the laser diode in parallel.

11. The driving and stabilization system according to claim 1, wherein the voltage comparison circuit comprises an AD8630-type operational amplifier.

12. The driving and stabilization system according to claim 1, wherein the switch protection circuit comprises an N-channel field effect transistor.

13. The driving and stabilization system according to claim 1, wherein the constant current driving circuit comprises an AD8630-type operational amplifier and an N-channel field effect transistor.

14. The driving and stabilization system according to claim 1, wherein the constant temperature stabilization circuit comprises a first constant temperature driving chip and a second constant temperature driving chip.

15. The driving and stabilization system according to claim 14, wherein the first constant temperature driving chip and the second constant temperature driving chip are MTD415TE-type constant temperature driving chips.

16. A pump laser system, comprising a pump laser and the driving and stabilization system for the pump laser according to claim 1.

* * * * *